United States Patent [19]

Ishihara et al.

[11] Patent Number: 5,255,323
[45] Date of Patent: Oct. 19, 1993

[54] DIGITAL SIGNAL PROCESSING DEVICE AND AUDIO APPARATUS USING THE SAME

[75] Inventors: Hiroyuki Ishihara; Kazunaga Ida, both of Tokyo; Kazuo Watanabe, Koufu; Soichi Toyama; Makio Yamaki, both of Tokyo, all of Japan

[73] Assignees: Pioneer Electronic Corporation; Pioneer Video Corporation, Tokyo, Japan

[21] Appl. No.: 880,302

[22] Filed: May 5, 1992

Related U.S. Application Data

[63] Continuation of Ser. No. 612,781, Nov. 14, 1990, abandoned.

[30] Foreign Application Priority Data

| Apr. 2, 1990 [JP] | Japan | 2-88782 |
| Apr. 13, 1990 [JP] | Japan | 2-98966 |
| Apr. 27, 1990 [JP] | Japan | 2-112744 |
| Apr. 27, 1990 [JP] | Japan | 2-112788 |

[51] Int. Cl.$^5$ .............................. H03G 5/00
[52] U.S. Cl. ................................. 381/103; 381/63; 381/98
[58] Field of Search ................. 381/63, 98, 103

[56] References Cited

U.S. PATENT DOCUMENTS

| 3,986,112 | 10/1976 | Hamilton | 324/77 CS |
| 4,228,402 | 10/1980 | Plummer | 381/102 |
| 4,501,149 | 2/1985 | Konno et al. | 73/587 |
| 4,661,982 | 4/1987 | Kitazato et al. | 381/103 |
| 4,870,690 | 9/1989 | Negishi et al. | 381/103 |
| 4,937,875 | 6/1990 | Hayashi | 381/63 |
| 5,065,433 | 11/1991 | Ida et al. | 381/63 |
| 5,111,530 | 5/1992 | Kutaragi et al. | 381/63 |

FOREIGN PATENT DOCUMENTS

3741253A1  6/1989  Fed. Rep. of Germany.
1568225    5/1980  United Kingdom.

Primary Examiner—John K. Peng
Assistant Examiner—Edward Lefkowitz
Attorney, Agent, or Firm—Perman & Green

[57] ABSTRACT

A digital signal processing device for outputting a holding data in an output register from a DSP in synchronism with a second clock pulse having a frequency lower than that of a first clock pulse for conducting arithmetic processing in the DSP. Accordingly, data to be output from the DSP can be directly read by a microcomputer, and contents in a coefficient memory and a delay time memory, for example, can be updated in accordance with the read data. Further, the digital signal processing device can be applied to an audio apparatus such as a loudness controller and a spectrum indicating apparatus.

9 Claims, 14 Drawing Sheets

Fig. 13

| | SW$_{IN1}$ | ON | — | OFF | ON | — | — | OFF | ON |
|---|---|---|---|---|---|---|---|---|---|
| F$_1$ | BPF & LPF | f$_1$ | — | 0 | f$_3$ | — | — | 0 | f$_5$ |
| | SW$_{OUT1}$ | OFF | ON | — | OFF | — | ON | — | OFF | f$_1$ LEVEL DETECTION   f$_1$ LEVEL INDICATION   f$_3$ LEVEL DETECTION   f$_3$ LEVEL INDICATION f$_2$ LEVEL DETECTION   f$_2$ LEVEL INDICATION   f$_4$ LEVEL DETECTION

| | SW$_{IN2}$ | ON | — | — | — | OFF | ON | — | — |
|---|---|---|---|---|---|---|---|---|---|
| F$_2$ | BPF & LPF | f$_2$ | — | — | — | 0 | f$_4$ | — | — |
| | SW$_{OUT2}$ | OFF | — | — | ON | — | OFF | — | ON |

DIGITAL SIGNAL PROCESSING DEVICE AND AUDIO APPARATUS USING THE SAME

This is a continuation of copending application Ser. No. 07/612,781 filed on Nov. 14, 1990 now abandoned.

BACKGROUND OF THE INVENTION

1. Field of the Invention

The present invention relates to a digital signal processing device and an audio apparatus such as a loudness controller and a spectrum indicating apparatus using the digital signal processing device.

2. Description of the Related Art

Recently known is a DSP (digital signal processor) capable of obtaining an output equivalent to circuit operation by arithmetically processing (e.g., four arithmetic operations) a digital signal converted from an analog signal at high speeds. The DSP includes an arithmetic processing means for arithmetically processing an input digital signal. The arithmetic processing means basically includes a data memory for storing an input digital signal data and a coefficient memory for storing plural coefficient data. The signal data and the coefficient data are sequentially read from the data memory and the coefficient memory, respectively, in accordance with a program, and these data are multiplied with each other in a multiplier. A multiplication result from the multiplier is accumulated every time the multiplication is executed. The coefficient data to be stored in the coefficient memory is controlled in writing by an external microcomputer, and when a content of arithmetic processing, e.g., a filter characteristic of a signal to be obtained by arithmetic processing is intended to be changed, the coefficient data are rewritten. A processing result data from the arithmetic processing means is output through an output register.

Constitutional elements in the DSP are operated in synchronism with a clock pulse to be generated from an internal clock generator. In the case of processing data such as audio data requiring operation of many steps in a short time, a frequency of the clock pulse must be high. However, if the frequency of the clock pulse is high, the data is output from the DSP at high speeds. Accordingly, the output data cannot be directly read by a normal microcomputer, and the control of the DSP such as rewriting of the coefficient data in the coefficient memory according to a processing result from the DSP cannot be carried out.

Further, it is known that a human auditory sensitivity is represented by a Fletcher-Munson curve wherein a frequency characteristic depends on a sound pressure. That is, treble and bass are harder to listen as a sound pressure becomes smaller. To compensate this, a sound system is provided with a loudness control circuit to be operated in association with a sound level adjusting volume so that when a sound volume is small, treble and bass are intensified, while as the sound volume increases, they are flattened.

However, in the conventional loudness control circuit, the frequency characteristic compensation is simply changed in accordance with an operational position of the sound level adjusting volume. As a result, there is a problem such that when an input audio signal level is large, treble and bass are excessively intensified, while when the input audio signal level is small, treble and bass are insufficient.

Further, a spectrum indicating apparatus for indicating a frequency distribution of an input signal such as an audio signal is known from Japanese Patent Publication No. 58-43700, for example. Such a conventional spectrum indicating apparatus is provided with a plurality of level detecting means each including a BPF (band pass filter), a detecting circuit and an LPF (low pass filter) so as to correspond to a plurality of predetermined frequency bands. A signal level of each band is detected by each level detecting means, and a detection level corresponding to each frequency band is indicated in an indicator.

Accordingly, the conventional spectrum indicating apparatus requires to have a plurality of level detecting means corresponding to the number of frequency bands so as to finely indicate the frequency distribution, thus causing complication of the construction.

SUMMARY OF THE INVENTION

It is a first object of the present invention to provide a digital signal processing device which can directly read data to be output from a DSP and control the DSP in accordance with a processing result from the DSP.

It is a second object of the present invention to provide an audio apparatus which can provide a good reproduced sound irrespective of an operational position of a sound level adjusting volume.

It is a third object of the present invention to provide an audio apparatus for spectrum indication which can eliminate the need of providing a plurality of level detecting means corresponding to the number of frequency bands so as to finely indicate a frequency distribution.

According to a first aspect of the present invention, there is provided a digital signal processing device comprising arithmetic processing means for arithmetically processing an input digital signal in accordance with a predetermined program, holding means for holding an output data from the arithmetic processing means and outputting a held output data at a timing that is synchronous with a clock pulse to be supplied thereto, and clock pulse generating means for supplying a first clock pulse synchronous with an operation timing of the arithmetic processing means to the holding means, wherein the clock pulse generating means supplies a second clock pulse having a frequency lower than that of the first clock pulse to the holding means in response to a select command.

According to a second aspect of the present invention, there is provided an audio apparatus for compensating a frequency characteristic to an input audio signal in an acoustic device having a sound level adjusting volume in an audio signal line, the audio apparatus comprising level detecting means for detecting a level of the input audio signal, position detecting means for detecting an operational position of the sound level adjusting volume, and filter means provided in the audio signal line and having a frequency characteristic to be changed in accordance with detecting outputs from the level detecting means and the position detecting means.

According to a third aspect of the present invention, there is provided an audio apparatus comprising at least two level detecting means each having a variable band filter passing only a component of an input signal in a band designated by a band designating signal to be supplied thereto, for detecting output levels of the variable band filters, designating signal generating means for generating the band designating signal designating one of plural different frequency bands at a predetermined timing and alternately supplying the band designating signal to the two level detecting means, and control means for reading a detection level by the level detecting means when a predetermined time has elapsed after supplying of the band designating signal into the variable band filter and indicating the read detection level corresponding to each band in indicating means.

BRIEF DESCRIPTION OF THE DRAWINGS

FIG. 13 is an illustration of the relation among the operation in filter circuits, a level detection timing and a level indicating timing.

DETAILED DESCRIPTION OF THE PREFERRED EMBODIMENTS

Figure 1:
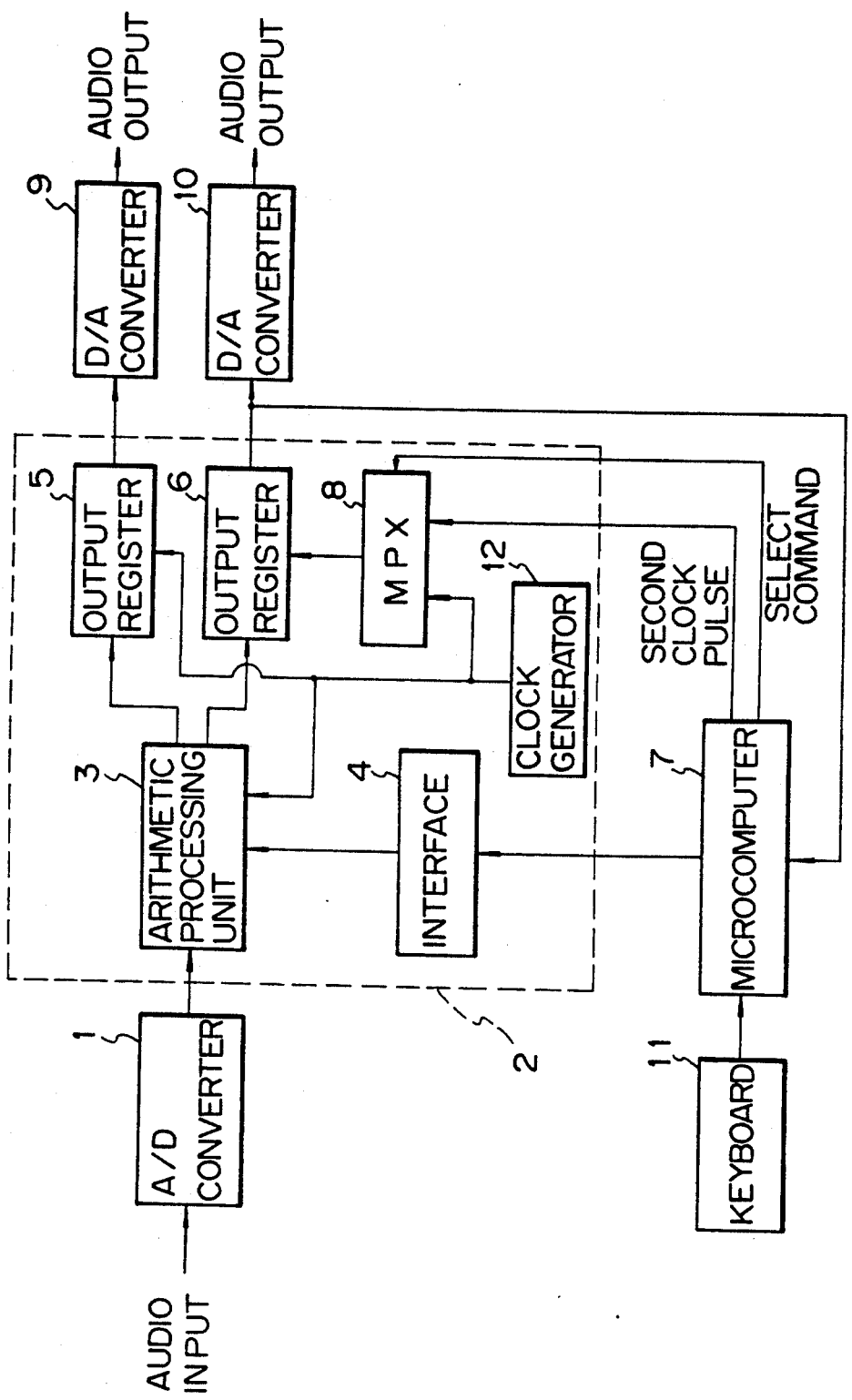
FIG. 1 is a block diagram showing a preferred embodiment of the digital signal processing device according to the present invention.

Referring to FIG. 1 which shows a preferred embodiment of the digital signal processing device according to the present invention, an analog audio signal is supplied to an A/D converter 1, and it is converted into a digital signal. An output of the A/D converter 1 is connected to a DSP 2. The DSP 2 includes an arithmetic processing unit 3 for arithmetically processing a digital signal data supplied from the A/D converter 1 in accordance with a program, an interface 4 for supplying to the arithmetic processing unit 3 a coefficient data, signal delay time data, program data, arithmetic processing start command and stop command from a microcomputer 7 which will be hereinafter described, and output registers 5 and 6 for holding an arithmetic result output from the arithmetic processing unit 3. Shifting and outputting of the data from the output register 6 is carried out in synchronism with a clock pulse to be supplied from an MPX (multiplexer) 8. The MPX 8 is supplied with first and second clock pulses, and it selectively outputs either the first clock pulse or the second clock pulse in accordance with a select command from the microcomputer 7. The first clock pulse is a pulse for conducting an operation timing of the arithmetic processing unit 3, and it is generated from a clock generator 12. The second clock pulse is a pulse for conducting an operation timing of the microcomputer 7, and a frequency of the second clock pulse is lower than that of the first clock pulse. The output register 5 is supplied with the first clock pulse. Output terminals of the registers 5 and 6 are connected to D/A converter 9 and 10, respectively. The digital signals supplied from the output registers 5 and 6 are converted into analog signals by the D/A converters 9 and 10. The output terminal of the output register 6 is also connected to the microcomputer 7.

The microcomputer 7 serves as the control means according to the present invention, and although not shown, it includes a microprocessor, interface, RAM, ROM and clock generator for generating the second clock pulse. A keyboard 11 is also connected to the microcomputer 7.

In the above digital signal processing device, the digital signal supplied from the A/D converter 1 to the DSP 2 is arithmetically processed by the arithmetic processing unit 3 in accordance with the program. For example, the arithmetic processing unit 3 carries out arithmetic processing for obtaining a filter characteristic for sound field control to the input digital audio signal and processing of average level detection for the input digital audio signal. A signal data as an arithmetic result is supplied to the output register 5 or 6. The output register 5 shifts and outputs the holding signal data in synchronism with the first clock pulse supplied thereto from the clock generator 12. Normally, the first clock pulse is supplied from the MPX 8 to the output register 6. The output registers 5 and 6 shift and output the respective holding signal data, and supply the same to the D/A converters 9 and 10, respectively.

Figure 2:
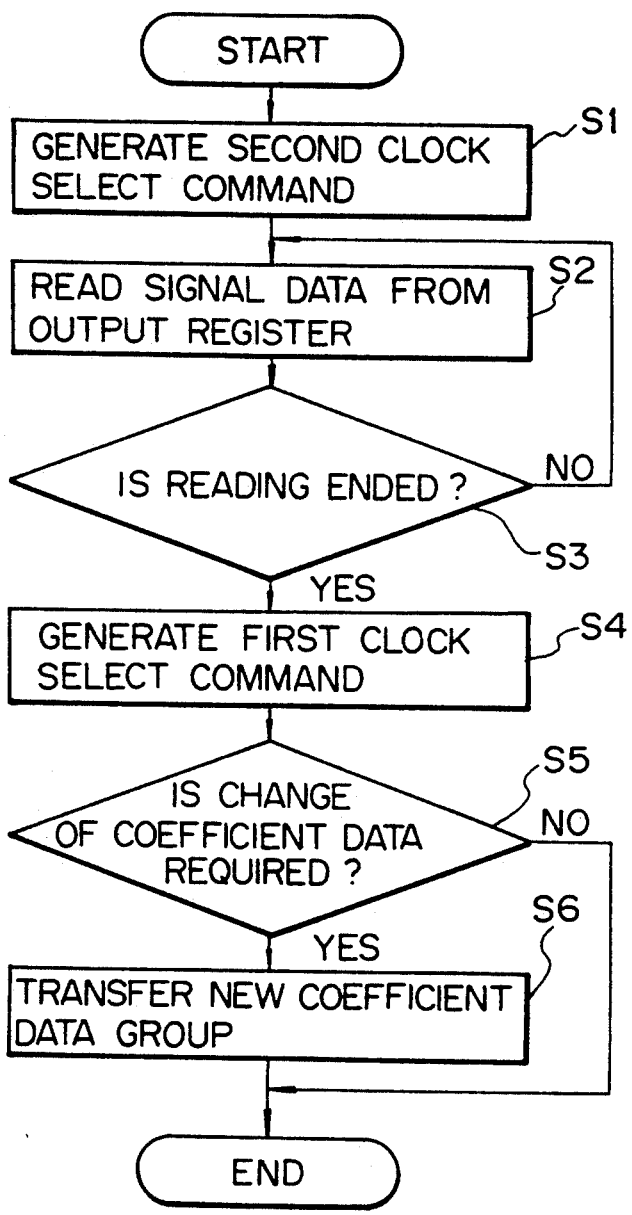
FIG. 2 is a flowchart showing the operation of a microcomputer shown in FIG. 1.

The microcomputer 7 generates a second clock select command at every predetermined timing as shown in FIG. 2 (step S1), for example. The second clock select command is supplied to the MPX 8. Although not shown, the second clock select command is also supplied to the output register 6 in order to inhibit data inputting into the output register 6. The MPX 8 supplies the second clock pulse to the output register 6 in response to the second clock select command. Accordingly, the output register 6 shifts and outputs the holding signal data in synchronism with the second clock pulse supplied thereto from the MPX 8. This signal data is shifted and output in synchronism with the operation timing of the microcomputer 7. The microcomputer 7 reads the signal data from the output register 6 (step S2), and if the reading is ended (step S3), the microcomputer 7 generates a first clock select command to the MPX 8 (step S4). The MPX 8 supplies the first clock pulse to the output register 6 in response to the first clock select command. After generating the first clock select command, the microcomputer 7 determines whether or not modification of the coefficient data is required in accordance with the signal data read from the output register 6 (step S5). In the case that the read signal data is a data indicative of an input average level, for example, if the input average level is equal to or higher than a predetermined value, it is determined whether or not a first coefficient data group is used. On the other hand, if the input average level is lower than the predetermined value, it is determined whether or not a second coefficient data group indicative of values greater than the first coefficient data group is used. If the modification of the coefficient data is required, a new coefficient data group is read from the ROM in the microcomputer 7, and is transferred to the arithmetic processing unit 3 (step S6). The arithmetic processing unit 3 includes a coefficient RAM 17 to be described hereinafter, and a storage content in the coefficient RAM 17 is updated by the coefficient data group transferred. Accordingly, the filter characteristic as the arithmetic result in the arithmetic processing unit 3 is modified.

Figure 3:
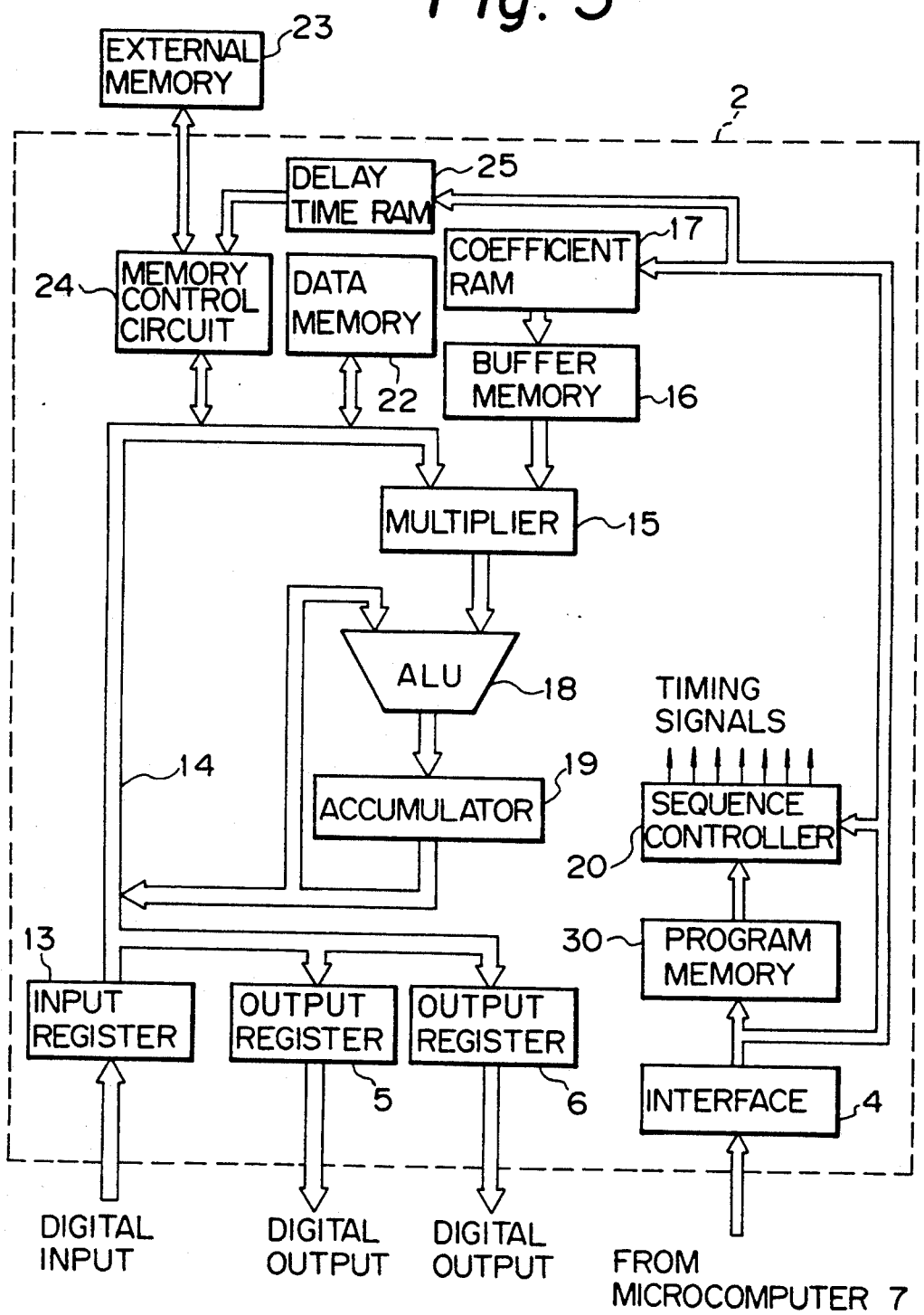
FIG. 3 is a block diagram schematically illustrating the construction of an arithmetic processing unit shown in FIG. 1.

Referring to FIG. 3 which shows a schematic construction of the arithmetic processing unit 3 including interface 4, output registers 5 and 6 in the DSP 2, a digital signal is supplied from the A/D converter 1 to an input register 13. The input register 13 is connected to a data bus 14. The data bus 14 is connected to a data memory 22 for temporarily storing a data group, and is also connected to one of two inputs of a multiplier 15. A buffer memory 16 for holding a coefficient data is connected to the other input of the multiplier 15. A coefficient RAM 17 for storing a coefficient data group is connected to the buffer memory 16. One of the coefficient data in the coefficient data group is sequentially read from the RAM 17 in accordance with a timing signal from a sequence controller 20, which is described hereinafter, and is supplied to the buffer memory 16 to be held therein. The coefficient data held in the buffer memory 16 is supplied to the multiplier 15. An ALU 18 is provided for accumulating a calculation output from the multiplier 15. The calculation output from the multiplier 15 is supplied to one of two inputs of the ALU 18, and the data bus 14 is connected to the other input of the ALU 18. A calculation output of the ALU 18 is connected to an accumulator 19, and an output of the accumulator 19 is connected to the data bus 14. A memory control circuit 24 for controlling data writing and reading to an external memory 23 is connected to the data bus 14. A delay time RAM 25 for storing a delay time data group is connected to the memory control circuit 24. Accordingly, the memory control circuit 24 controls writing and reading of input audio signal data to the external memory 23 so as to delay the audio signal data by each delay time data stored in the delay time RAM 25. The data bus 14 is also connected to the output registers 5 and 6.

The operation of the input register 13, the multiplier 15, the coefficient RAM 17, the ALU 18, the accumulator 19 and the memory control circuit 24 is controlled by the sequence controller 20. The sequence controller 20 is operated in accordance with a processing program written in a program memory 30 and a command from the microcomputer 7. The microcomputer 7 controls rewriting of the processing program and rewriting of the coefficient data in the RAM 17 and the delay time data of the RAM 25 in accordance with key operation of the keyboard 11.

In the DSP 2 including the above arithmetic processing unit 3, the digital audio signal data is supplied through the input register 13 to the data memory 22, and is stored therein. The sequence controller 20 controls a timing of reading the data from the input register 13, a timing of selectively transferring the data from the data memory 22 to the multiplier 15, a timing of outputting each coefficient data from the RAM 17, a multiplication timing in the multiplier 15, an addition timing in the ALU 18, and a timing of outputting the data of arithmetic result from the output of the accumulator 19.

Under the control of these timings, the input audio signal data is read from the data memory 22, and is supplied through the data bus 14 to the memory control circuit 24. The memory control circuit 24 sequentially writes the supplied signal data into the external memory 23. On the other hand, the delay time data is sequentially read from the delay time RAM 25 in accordance with the timing signal from the sequence controller 20. When a delay time designated by the delay time data has elapsed, the signal data is sequentially read from the external memory 23 by the memory control circuit 24. The read signal data is supplied through the data bus 14 to the data memory 22, and is sequentially stored as a delay signal data.

The audio signal data or the delay signal data obtained by the above data delay processing is sequentially read from the data memory 22, and is supplied to the multiplier 15. On the other hand, the coefficient data is sequentially read from the RAM 17, and is supplied to the buffer memory 16 to be held therein. Then, the coefficient data is sequentially supplied from the buffer memory 16 to the multiplier 15, while the data is sequentially supplied from the data memory 22 to the multiplier 15. These data are sequentially multiplied in the multiplier 15. A present value obtained by the multiplication is added to a previous value (i.e., a value held in the accumulator 19) in the ALU 18. An arithmetic result obtained by the ALU 18 is held in the accumulator 19. In this manner, an initial reflective sound data and a filter characteristic processing data, for example, are prepared.

Although the holding data in the output register 6 is read by the microcomputer 7 at every predetermined timing in the above preferred embodiment, the holding data may be read by the microcomputer 7 at a timing of obtaining an arithmetic result from the arithmetic processing unit 3.

In the case where the holding data in the output register 6 to be read by the microcomputer 7 is a data indicative of an average value of input signals, the program of the DSP 2 is preliminarily formed so that the arithmetic processing unit 3 prepares an average value data in a part of the arithmetic processing.

According to the present invention as described above, the clock pulse for outputting the holding data from the holding means for holding an output data from the arithmetic processing means is selected from the first clock pulse synchronous with the operation timing of the arithmetic processing means to the second clock pulse having a frequency lower than that of the first clock pulse in response to the select command. The holding data in the holding means can be output at a speed lower than the processing speed of the DSP. Therefore, the output data from the DSP can be directly read by the control means such as a microcomputer. Accordingly, contents in the coefficient memory and the delay time memory, for example, can be updated in accordance with the read data, thus effectively utilizing the DSP.

Figure 4:
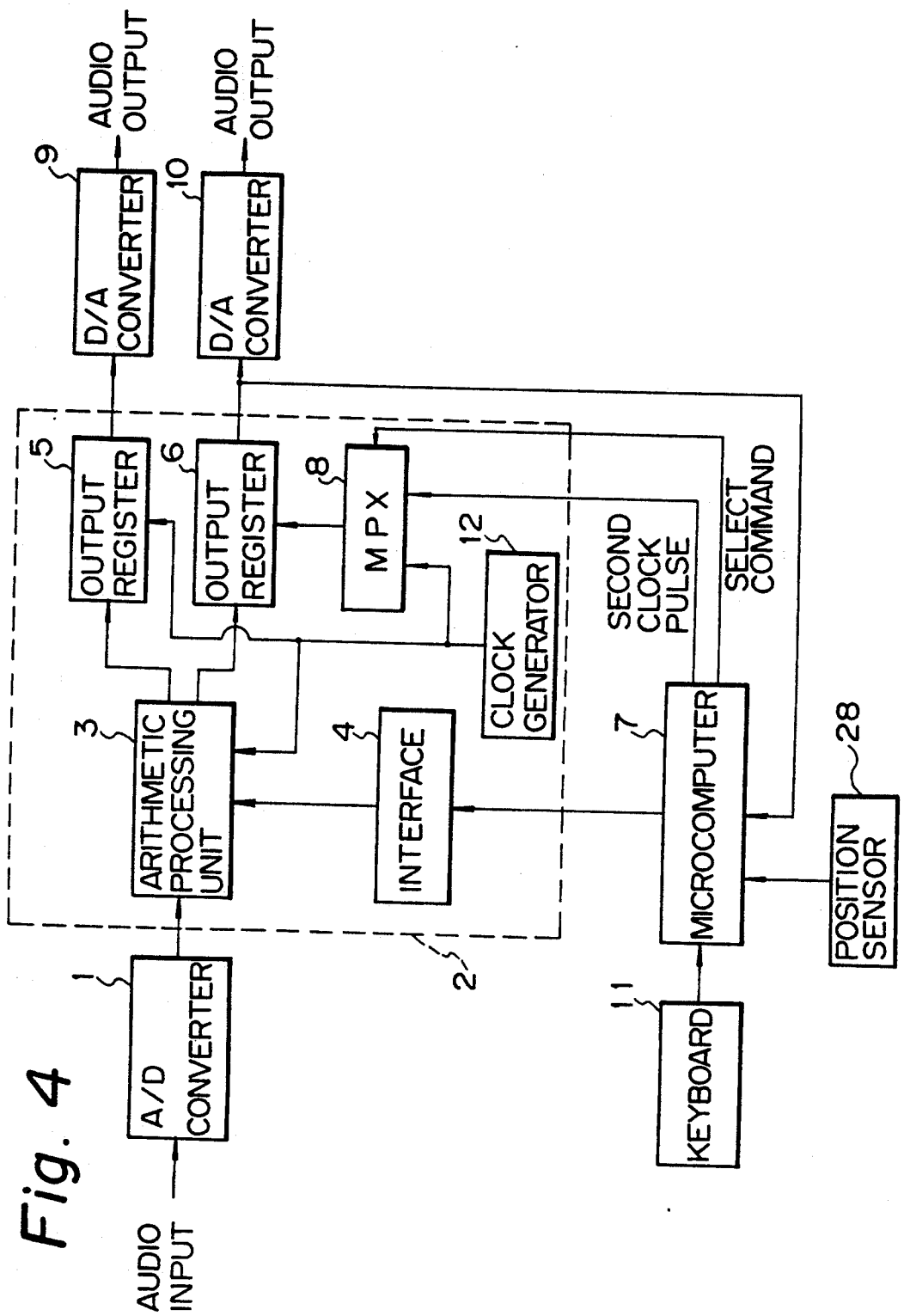
FIG. 4 is a block diagram showing a preferred embodiment of the audio apparatus according to the present invention.

Referring next to FIG. 4 which shows a preferred embodiment of the audio apparatus for loudness control according to the present invention, the digital signal processing device shown in FIG. 1 is employed, and the construction of the audio apparatus is the same as that shown in FIG. 1 except that a position sensor 28 is connected to the microcomputer 7. The position sensor 28 outputs a data indicative of an operational position of a sound level adjusting volume (not shown). In the case that the sound level adjusting volume is a mechanical volume, the operational position is detected as a voltage by a potentiometer, and the voltage is converted into a digital data. In the case that the sound level adjusting volume is an electronic volume, a counter is provided to count up and down a count value in accordance with an up-down command key and obtain a digital data. The sound level adjusting volume is provided on a rear stage of the D/A converter 9.

Figure 5:
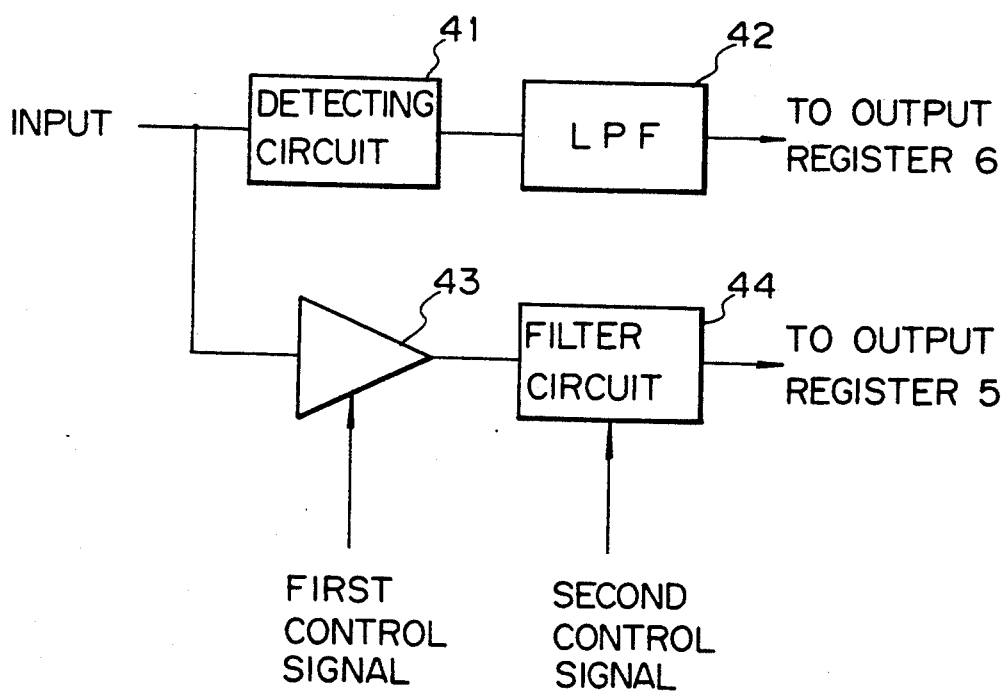
FIG. 5 is a block diagram showing a circuit to be formed by arithmetic processing by a DSP shown in FIG. 4.

In the above audio apparatus, a digital signal is supplied from the A/D converter 1 into the DSP 2, and it is arithmetically processed by the arithmetic processing unit 3 in accordance with a program. By this arithmetic processing, a circuit as shown in FIG. 5 is realized. That is, a detecting circuit 41 and an ATT 43 are connected to the output terminal of the A/D converter 1. An LPF 42 is connected to an output terminal of the detecting circuit 41, and an output signal from the LPF 42 is supplied to the output register 6. The ATT 43 changes an attenuation rate in accordance with a first control signal. A filter circuit 44 is connected to an output terminal of the ATT 43. The filter circuit 44 changes a frequency characteristic in accordance with a second control signal. An output signal from the filter circuit 44 is supplied to the output register 5. The operation of the LPF 42 and the filter circuit 44 can be obtained by the same arithmetic processing by the DSP 2 as shown in FIG. 3.

The digital audio signal supplied to the DSP 2 is detected by the detecting circuit 41 to provide an absolute value of the digital audio signal indicative of a positive level. The detected digital audio signal is averaged by the LPF 42, and is then held as an input audio signal level in the output register 6.

A holding data indicative of the detection level held in the output register 6 is read by the microcomputer 7 in accordance with the second clock pulse.

Figure 6:
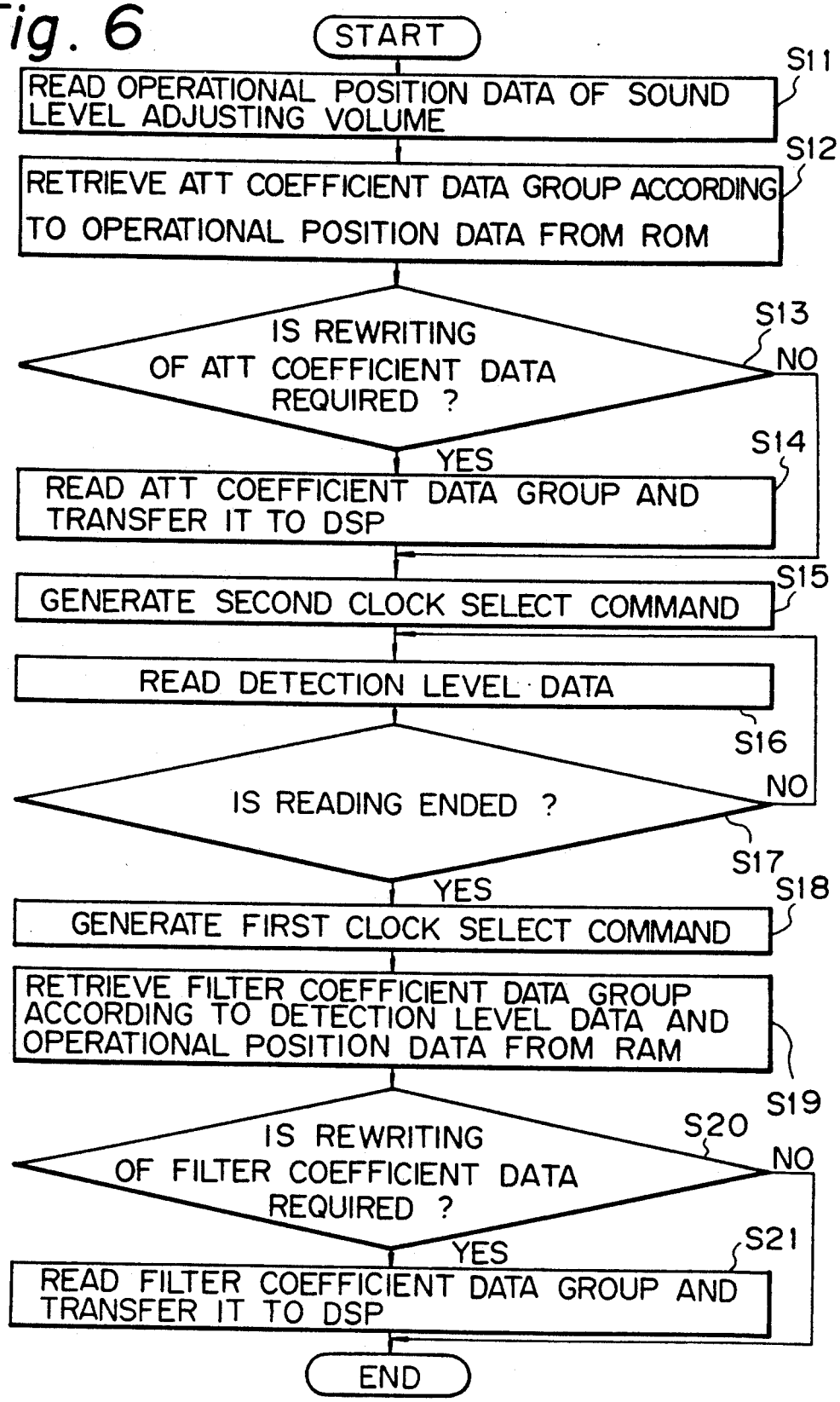
FIG. 6 is a flowchart showing the operation of a microcomputer shown in FIG. 4.

The microcomputer 7 reads an operational position data of the sound level adjusting volume from the position sensor 28 every predetermined period, for example, as shown in FIG. 6 (step S11). Then, an ATT coefficient data group to be defined in accordance with the operational position data is retrieved from the ROM in the microcomputer 7 (step S12). Then, it is determined whether or not rewriting of the ATT coefficient data group is required (step S13). If a coefficient data group different from that being presently used for arithmetic processing of the ATT 43 in the arithmetic processing unit 3 is retrieved, it is determined that the rewriting of the ATT coefficient data group is required. In this case, the retrieved ATT coefficient data group is read from the ROM, and is transferred as the first control signal to the arithmetic processing unit 3 (step S14).

Thereafter, the microcomputer 7 generates a second clock select command (step S15). The second clock select command is supplied to the MPX 8. Although not shown, the second clock select command is also supplied to the output register 6 to inhibit data inputting into the output register 6. The MPX 8 supplies a second clock pulse to the output register 6 in response to the second clock select command. Accordingly, the output register 6 shifts and outputs the detection level data as the holding data in synchronism with the second clock pulse supplied thereto. The shifting and outputting of the detection level data is synchronous with an operation timing of the microcomputer 7. Accordingly, the microcomputer 7 reads the detection level data from the output register 6 (step S16). If the reading is ended (step S17), the microcomputer 7 generates a first clock select command (step S18). Then, the MPX 8 supplies a first clock pulse to the output register 6 in response to the firs clock select command. After generating the first clock select command, the microcomputer 7 retrieves from the ROM in the microcomputer 7 a filter coefficient data group to be defined in accordance with the detection level data read from the output register 6 and the operational position data (step S19). Then, it is determined whether or not rewriting of the filter coefficient data group is required (step S20). If a coefficient data group different from that being presently used for arithmetic processing of the filter circuit 44 in the arithmetic processing unit 3 is retrieved, it is determined that the rewriting of the filter coefficient data group is required. In this case, the retrieved filter coefficient data group is read from the ROM, and is transferred as the second control signal to the arithmetic processing unit 3 (step S21).

By rewriting the filter coefficient data group in this manner, the filter circuit 44 using this filter coefficient data group is realized in the arithmetic processing, and the frequency characteristic is changed in accordance with the filter coefficient data group.

The frequency characteristic of the filter circuit 44 is such that an output level of treble and bass becomes higher than that of a medium frequency component as a level indicated by the operational position data of the sound level adjusting volume becomes nearer to a MIN (minimum) position, and that the output level becomes flatter as the level indicated by the operational position data becomes nearer to a MAX (maximum) position. Further, the frequency characteristic is such that even when the level indicated by the operational position data is near the MIN position, the output level becomes flatter as an input signal level becomes larger.

On the other hand, by rewriting the ATT coefficient data group as mentioned above, the ATT 43 using the ATT coefficient data group is realized in the arithmetic processing, and the attenuation rate is changed in accordance with the ATT coefficient data group.

Figure 7:
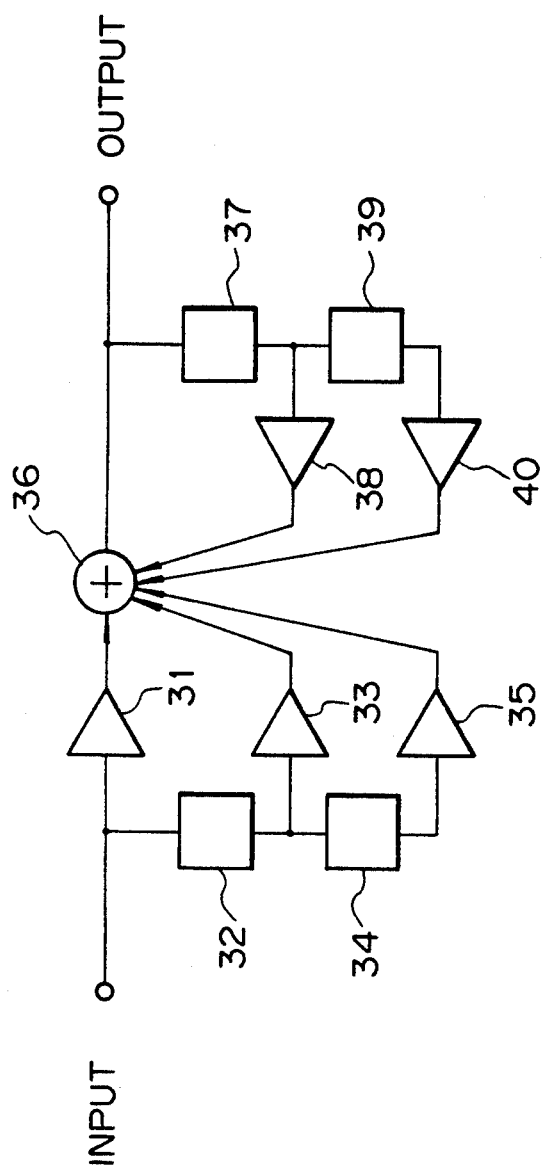
FIG. 7 is a block diagram showing the construction of an IIR filter.

Referring to FIG. 7 which shows a secondary IIR filter constructing an equivalent circuit of the LPF 42 and the filter circuit 44 to be obtained in the DSP 2, a coefficient multiplier 31 and a delay element 32 are connected to an input terminal to which an audio data signal is supplied. An output terminal of the delay element 32 is connected to a coefficient multiplier 33 and a delay element 34. An output terminal of the delay element 34 is connected to a coefficient multiplier 35. Output terminals of the coefficient multipliers 31, 33 and 35 are connected to an adder 36. An output terminal of the adder 36 is connected to a delay element 37. An output terminal of the delay element 37 is connected to a coefficient multiplier 38 and a delay element 39. An output terminal of the delay element 39 is connected to a coefficient multiplier 40. Output terminal s of the coefficient multipliers 38 and 40 are also connected to the adder 36.

Each delay time of the delay elements 32, 34, 37 and 39 corresponds to a one sampling period. Accordingly, the data to be supplied to the multiplier 33 is a data before the data to be supplied to the multiplier 31 by one sample, and the data to be supplied to the multiplier 35 is a data before the data to be supplied to the multiplier 31 by two samples. Similarly, the data to be supplied to the multiplier 40 is a data before the data to be supplied to the multiplier 38.

According to setting of each coefficient in the multipliers 31, 33, 35, 38 and 40, a filter circuit and an LPF can be obtained, and frequency characteristics thereof can be changed. Accordingly, in the DSP 2, a filter coefficient data group and an LPF coefficient data group transferred from the microcomputer 7 are stored in the coefficient RAM 17, and they are read from the RAM 17 in a predetermined sequence to be supplied to the multiplier 15. That is, in realizing the filter circuit 44, a filter coefficient data is sequentially supplied to the multiplier 15, thereby forming the filter circuit 44 having a frequency characteristic to be defined in accordance with the supplied filter coefficient data group. Further, in realizing the LPF 42, an LPF coefficient data is sequentially supplied to the multiplier 15, thereby forming the LPF 42 having a frequency characteristic to be defined in accordance with the supplied LPF coefficient data group.

In the case where such a secondary IIR filter is formed by digital processing in the DSP 2, the operation of the DSP 2 is as follows:

In a first step, an input audio signal data $d_n$ is read from an n-th address in the data memory 22, and a coefficient data $a_2$ (corresponding to the coefficient in the multiplier 35) is read from the RAM 17 to be transferred to the buffer memory 16. The signal data $d_n$ is multiplied by the coefficient data $a_2$ in the multiplier 15. In a third step after the first step by two steps, 0 is added to a multiplication result $a_2 \cdot d_n$ in the ALU 18, and an addition result is held in the accumulator 19.

In a second step, a signal data $d_{n-1}$ is read from a $(n-1)$-th address in the data memory 22, and it is multiplied by a coefficient data $a_1$ (corresponding to the coefficient in the multiplier 33) newly read from the RAM 17 in the multiplier 15. In a fourth step, a holding value in the accumulator 19 (i.e., the addition result obtained in the third step) is added to a multiplication result $a_1 \cdot d_{n-1}$ in the ALU 18, and an addition result is held in the accumulator 19.

In the third step, an input signal data IN is transferred from the input register 13 to an $(n-2)$-th address in the data memory 22 and the multiplier 15, and it is multiplied by a coefficient data $a_0$ (corresponding to the coefficient in the multiplier 31) in the multiplier 15. In a fifth step, a holding value in the accumulator 19 (i.e., the addition result obtained in the fourth step) is added to a multiplication result $a_0 \cdot IN$ in the ALU 18, and an addition result is held in the accumulator 19.

In the fourth step, a signal data $d_{n+2}$ is read from an $(n+2)$-th address in the data memory 22, and it is multiplied by a coefficient data $b_2$ (corresponding to the coefficient in the multiplier 40) newly read from the RAM 17 in the multiplier 15. In a sixth step, a holding value in the accumulator 19 (i.e., the addition result obtained in the fifth step) is added to a multiplication result $b_2 \cdot d_{n+2}$ in the ALU 18, and an addition result is held in the accumulator 19.

In the fifth step, a signal data $d_{n+1}$ is read from an $(n+1)$-th address in the data memory 22, and it is multiplied by a coefficient data $b_1$ (corresponding to the coefficient in the multiplier 38) in the multiplier 15. In a seventh step, a holding value in the accumulator 19 (i.e., the addition result obtained in the sixth step) is added to a multiplier result $b_1 \cdot d_{n+1}$ in the ALU 18, and an addition result is held as an output data in the accumulator 19.

In the case where the input data is negative, the detecting circuit 41 can be formed in the DSP 2 by converting a negative sign of the data into a positive sign. Further, the ATT 43 can be obtained by multiplying the input data by the coefficient data in the ATT coefficient data group in the multiplier 15.

In the above preferred embodiment, the level detecting means for detecting an input audio signal level and the filter means capable of changing a frequency characteristic in accordance with the detection outputs from the level detecting means and the position detecting means are constructed by a DSP. However, the present invention is not limited to this preferred embodiment. For example, the circuit shown in FIG. 5 may be constructed by an analog circuit.

According to the audio apparatus of the present invention as described above, a filter circuit capable of changing a frequency characteristic is provided in an audio signal line, and an input audio signal level and an operational position of a sound level adjusting volume are detected. The frequency characteristic of the filter circuit is changed in accordance with detection outputs. Thus, compensation of the frequency characteristic for an input audio signal can be carry out.

Accordingly, it is possible to avoid the problem such that when the input audio signal level is high, treble and bass are excessively intensified, or when the input audio signal level is low, treble and bass are insufficient. Thus, a user can listen to a reproduced sound having a good tone regardless of the operational position of the sound level adjusting volume.

Figure 8:
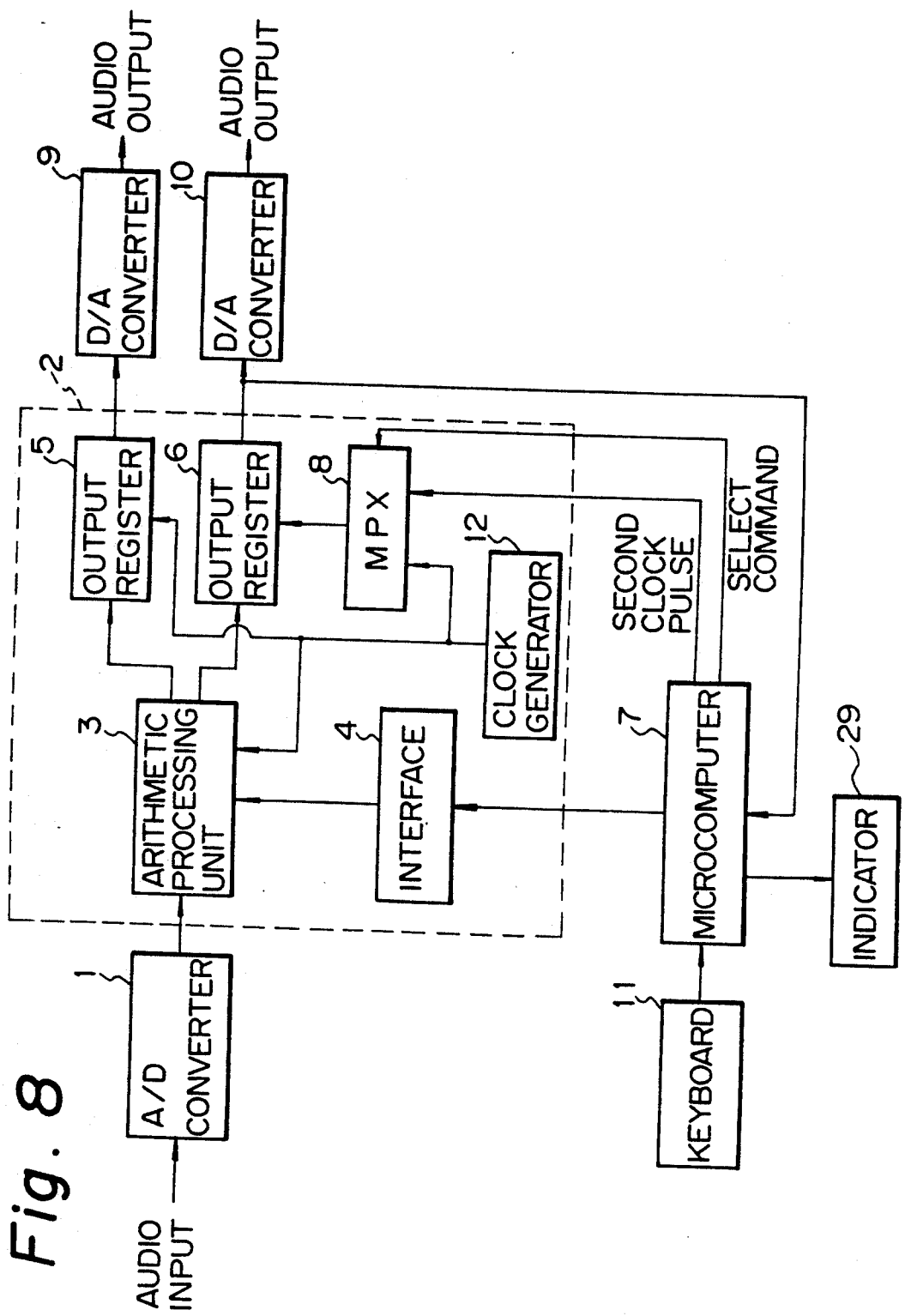
FIG. 8 is a block diagram showing another preferred embodiment of the audio apparatus according to the present invention.
Figure 9:
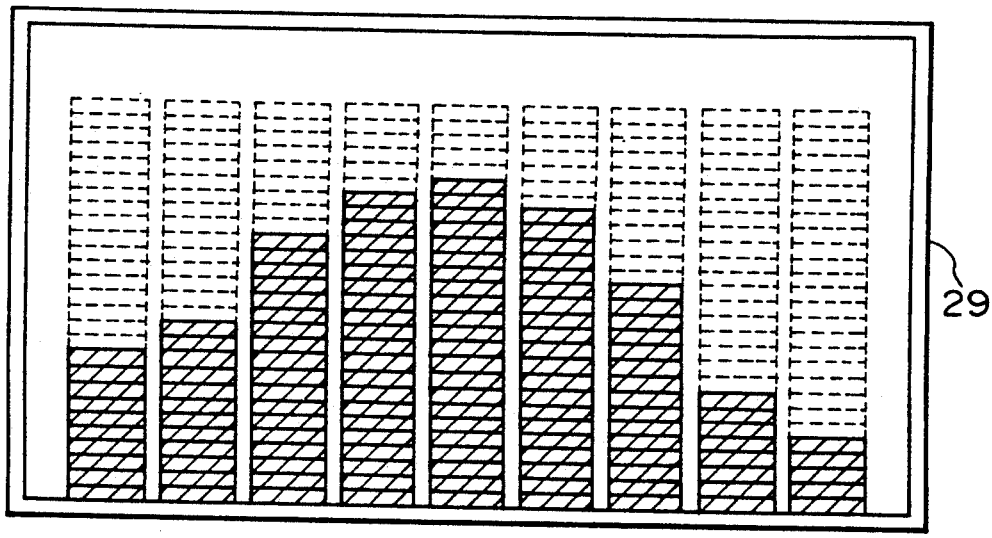
FIG. 9 is a view showing an indicator shown in FIG. 8.

Referring next to FIG. 8 which shows another preferred embodiment of the audio apparatus for spectrum indication according to the present invention, the digital signal processing device shown in FIG. 1 is employed, and the construction of the audio apparatus is the same as that shown in FIG. 1 except that an indicator 29 is connected to the microcomputer 7. As shown in FIG. 9, the indicator 29 carries out indication of vertical bars, the number of which corresponds to the number T of bands (e.g., T=9 in FIG. 9). The indicator 29 is comprised of LCD or LED.

Figure 10:
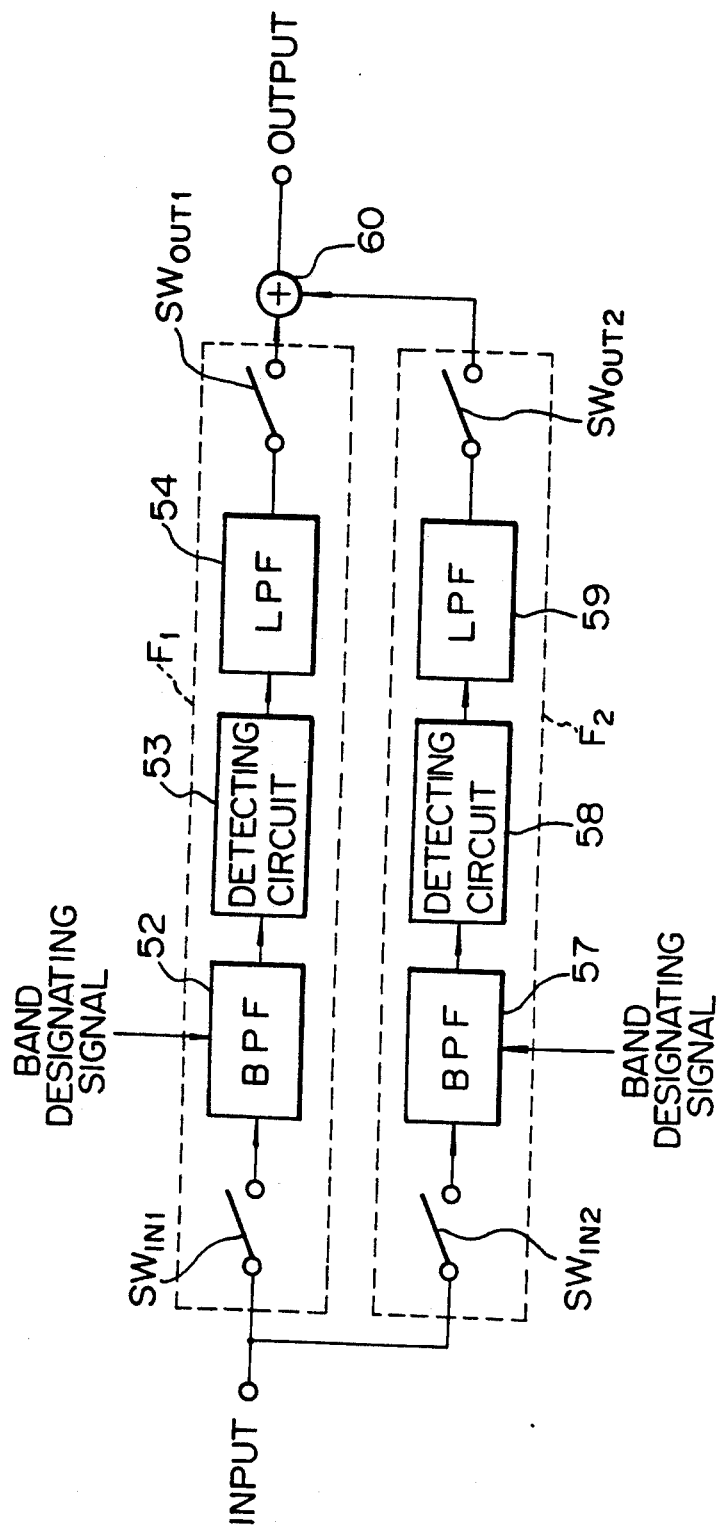
FIG. 10 is a block diagram showing a circuit to be formed by arithmetic processing by a DSP shown in FIG. 8.

In the audio apparatus as mentioned above, a digital signal is supplied from the A/D converter 1 in the DSP 2, and is arithmetically processed by the arithmetic processing unit 3 in accordance with a program. By this arithmetic processing, a circuit as shown in FIG. 10 is realized. That is, two filter circuits $F_1$ and $F_2$ as the detecting means for detecting a signal level of only an input signal component in a band designated by a band designating signal to be supplied thereto are connected to the output terminal of the A/D converter 1. The filter circuit $F_1$ is comprised of an input switch $SW_{IN1}$, BPF 52, detecting circuit 53, LPF 54 and output switch $SW_{OUT1}$, while the filter circuit $F_2$ is comprised of an input switch $SW_{IN2}$, BPF 57, detecting circuit 58, LPF 59 and output switch $SW_{OUT2}$. The BPFs 52 and 57 are provided as variable band filters capable of changing a pass band. The pass band is selectively set to one of $f_1 - f_T$ (where T denotes the number of bands, and it is integers greater than 2) by changing a coefficient data group as will be hereinafter described. An adder 60 is connected to output terminals of the filter circuits $F_1$ and $F_2$, so that detection levels by the filter circuits $F_1$ and $F_2$ are added by the adder 60. An addition level by the adder 60 is supplied to the output register 6 to be held therein for every band.

When a spectrum indication start command is generated by operating the keyboard 11 to be supplied to the microcomputer 7, the microcomputer 7 starts a spectrum indicating operation. In the spectrum indicating operation, the microcomputer 7 generates a command for forming each element such as BPF and an ON/OFF command for the input and output switches, for example, and supplies these commands to the DSP 2. After receiving these commands, the DSP 2 forms the filter circuits $F_1$ and $F_2$ in accordance with a program, and carries out arithmetic operation for level detection for each band.

Figure 11:
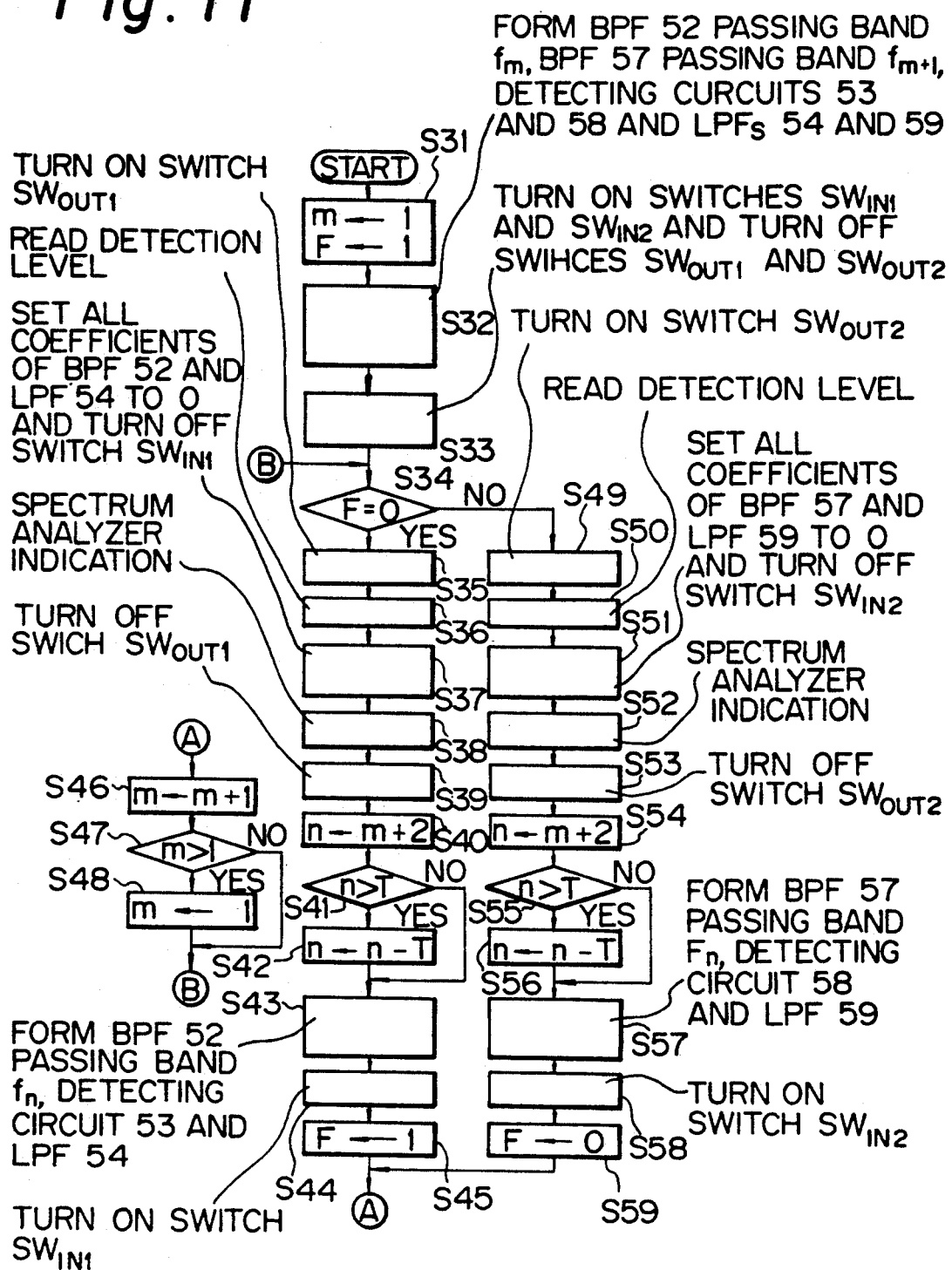
FIG. 11 is a flowchart showing the operation of the DSP.

As shown in FIG. 11, the microcomputer 7 sets a variable m to 1 and a flag F to 1 (step S31). Then, the BPF 52 passing a band $f_m$ and the BPF 37 passing a band $f_{m+1}$ are realized with the detecting circuits 53 and 58 and the LPFs 54 and 59 in the DSP 2 by the microcomputer 7 (step S32). Then, the input switches $SW_{IN1}$ and $SW_{IN2}$ are turned on, and the output switches $SW_{OUT1}$ and $SW_{OUT2}$ are turned off (step S33). Accordingly, the DSP 2 starts a level detecting operation for a component of the band $f_m$ of the input signal in the filter circuit $F_1$ in accordance with the program, and also starts a level detecting operation for a component of the band $f_{m+1}$ of the input signal in the filter circuit $F_2$ in accordance with the program.

Then, the microcomputer 7 determines whether or not the flag F is 0 (step S34). If $F=0$, the output switch $SW_{OUT1}$ is turned on (step S35). Accordingly, the component of the band $f_m$ of the input signal detected by the filter circuit $F_1$ (however, a band $f_n$ is employed from the execution of step S35 in the next time) is supplied as a data to the output register 6 to be held therein. Accordingly, the microcomputer 7 reads the detection level from the output register 6 (step S36).

Figure 12:
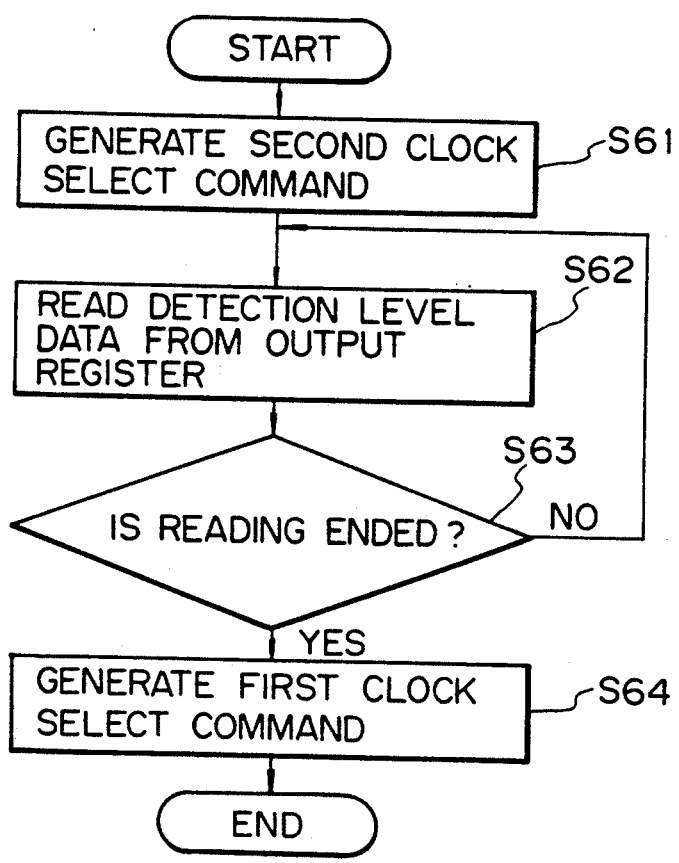
FIG. 12 is a flowchart showing a detection level reading operation of the microcomputer.

In reading the detection level, the microcomputer 7 generates a second clock select command as shown in FIG. 12 (step S61), and supplies the second clock select command to the MPX 8. Although not shown, the second clock select command is also supplied to the output register 6 to inhibit data inputting into the output register 6. The MPX 8 supplies a second clock pulse to the output register 6 in response to the second clock select command. Accordingly, the output register 6 shifts and outputs the detection level data as the holding data in synchronism with the second clock pulse supplied thereto. The shifting and outputting of the detection level data is synchronous with an operation timing of the microcomputer 7. Accordingly, the microcomputer 7 reads the detection level data from the output register 6 (step S62), and if the reading is ended (step S63), the microcomputer 7 generates a first clock select command (step S64). Then, the MPX 8 supplies a first clock pulse again to the output register 6 in response to the first clock select command.

After reading the detection level data from the output register 6, the microcomputer 7 sets all the coefficient data for the realization of the BPF 52 and the LPF 54 to 0, and turns off the input switch $SW_{IN1}$ (step S37). Then, the microcomputer 7 supplies a driving signal to the indicator 29 in accordance with the detection level data to thereby carry out spectrum analyzer indication (step S38). After the spectrum analyzer indication, the output switch $SW_{OUT1}$ is turned off (step S39), and 2 is added to the variable m to obtain a variable n (step S40). Then, it is determined whether or not the variable n is greater than the number T of bands (step S41). If $n>T$, T is subtracted from the variable n (step S42), while if $n \leq T$, the variable n is held as it is.

Then, the BPF 52 passing a band $f_n$ is realized with the detecting circuit 53 and the LPF 54 in the DSP 2 (step S43), and the input switch $SW_{IN1}$ is turned on (step S44). Accordingly, the DSP 2 starts the level detecting operation for a component of the band $f_n$ of the input signal in the filter circuit $F_1$. Then, the flag F is set to 1 (step S45), and 1 is added to the variable m (step S46). It is determined whether or not m is greater than T (step S47). If $m>T$, the variable m is set to 1 (step S48), while if $m \leq T$, the variable m is held as it is. After execution of step S47 or S48, the program proceeds to step S34.

When the program returns to step S34 after execution of step S47 or S48, $F=1$ is held, and accordingly the program proceeds to step S49. In step S49, the output switch $SW_{OUT2}$ is turned on. Accordingly, the component of the band $f_{m+1}$ of the input signal detected by the filter circuit $F_2$ (however, the band $f_n$ is employed from the execution of step S49 in the next time) is supplies as a data to the output register 6 to be held therein. Accordingly, the microcomputer 7 reads the detection level from the output register 6 (step S50). The reading operation of the detection level is carried out in accordance with steps S61–S64 as previously mentioned.

After reading the detection level data from the output register 6, the microcomputer 7 sets all the coefficient data for the realization of the BPF 57 and the LPF 59 to 0, and turns off the input switch $SW_{IN2}$ (step S51). Then, the microcomputer 7 supplies a driving signal to the indicator 29 in accordance with the detection level data to thereby carry out spectrum analyzer indication (step S52). After the spectrum analyzer indication, the output switch $SW_{OUT2}$ is turned off (step S53), and 2 is added to the variable m to obtain a variable n (step S54). Then, it is determined whether or not the variable n is greater than the number T of bands (step S55). If $n>T$, T is subtracted from the variable n (step S56), while if $n \leq T$, the variable n is held as it is.

Then, the BPF 57 passing the band $f_n$ is realized with the detecting circuit 58 and the LPF 59 in the DSP 2 (step S57), and the input switch $SW_{IN2}$ is turned on (step S58). Accordingly, the DSP 2 starts the level detecting operation for the band $f_n$ of the input signal in the filter circuit $F_2$. Then, the flag F is reset to 0 (step S59), and the program proceeds to step S46.

In this manner, the microcomputer 7 repeats the level detecting operation to sequentially obtain the detection level for each band to be held in the output register 6 of the DSP 2 and sequentially generate the driving signal in accordance with the detection level. A signal level for each band is indicated in the indicator 29 as shown in FIG. 9 in accordance with the driving signal which indicates the indication level of the vertical bars of the number T, and the indication level for the band read is updated every time the detection level data is read.

FIG. 13 shows the relation among the operation in each filter circuit, a level detecting timing and a level indication timing. In FIG. 13, arrows → indicate that the previous state is maintained, and 0 indicates that the BPF and the LPF are not realized.

The operation of the BPF and the LPF can be obtained by the same arithmetic processing by the DSP 2 as that shown in FIG. 3. An equivalent circuit of the BPF and the LPF to be obtained by the DSP 2 can be constructed as the secondary IIR filter shown in FIG. 7.

In FIG. 7, the BPF and the LPF can be obtained and the frequency characteristics thereof can be changed in accordance with the setting of each coefficient in the multipliers 31, 33, 35, 38 and 40. Accordingly, a coefficient data group for the bands $f_1$–$f_n$ of the BPF and a coefficient data group for the LPF are stored in the coefficient RAM 17 in the DSP 2, and a coefficient data is read from the RAM 17 in a predetermined sequence to be supplied to the multiplier 15. That is, the coefficient data group is supplied as the band designating signal to the multiplier 15 to thereby set the band.

According to the audio apparatus for spectrum indication as described above, there are provided at least two level detecting means each including a variable band filter for passing only a component of an input signal in a band designated by a band designating signal to be supplied thereto. The detecting means detects an output level of each variable band filter. The band designating signal which designates one of plural different frequency bands is generated at a predetermined timing, and is alternately supplied to the two level detecting means. A detection level detected by the level detecting means is read when a predetermined time has elapsed after the supply of the band designating signal, and the read detection level corresponding to the designated band is indicated in an indicating means. Accordingly, it is not necessary to make the number of the level detecting means accord with the number of the frequency bands, but at least two level detecting means are only necessary to thereby make the construction simple. Particularly, by using the DSP, the level detecting means for different bands can be easily formed in a single element, so that the audio apparatus can be made compact in general.

Further, as mentioned above, the detection level detected by the level detecting means is read when a predetermined time has elapsed after the supply of the band designating signal into the variable band filter. In other words, until a frequency characteristic of the variable band filter becomes stable in changing the designated band, the detection level is not read. Therefore, erroneous detection of the level can be prevented to thereby ensure precise spectrum indication.

Furthermore, as at least two level detecting means are used, a time loss until stabilization of the operation can be avoided by repeating the following operation, for example. That is, after the band of one of the two level detecting means is changed, the detection level is read from the other level detecting means. Immediately thereafter, the band of the other level detecting means is changed, and the detection level is read from the one level detecting means.

Figure 14:
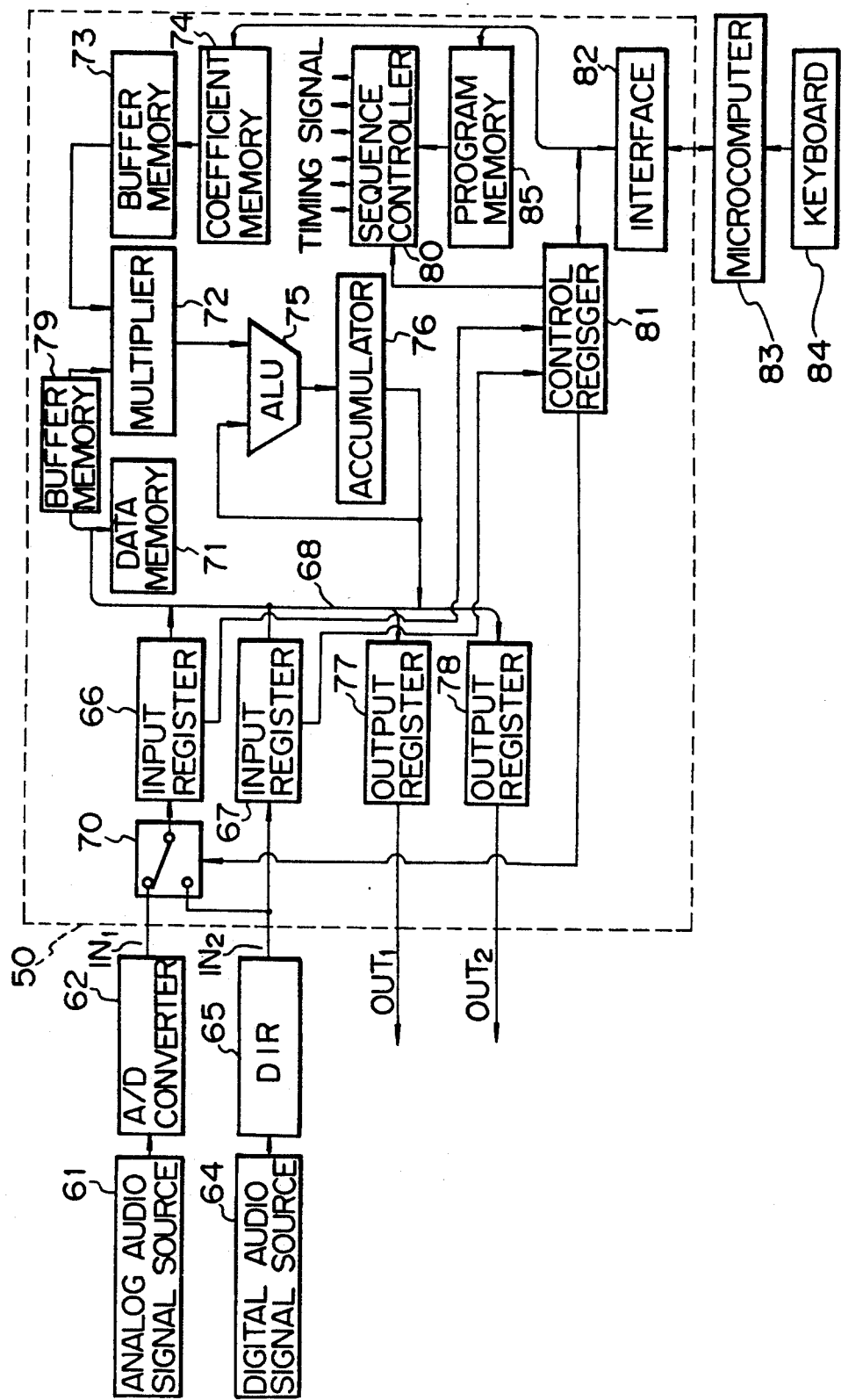
FIG. 14 is a block diagram of a DSP according to the present invention.

Referring next to FIG. 14 which shows a DSP 50 having two input ports $IN_1$ and $IN_2$, an analog audio signal is supplied from an analog audio signal source 61 such as a tuner through an A/D converter 62 to the first input port $IN_1$, and a digital audio signal is supplied from a digital audio signal source 64 such as a CD (compact disk) player through a DIR (digital audio interface) 65 to the second input port $IN_2$. The first input port $IN_1$ is connected to a selector switch 70, so that an input digital signal to the first input port $IN_1$ is supplied through the selector switch 70 to an input register 66. The second input port $IN_2$ is directly connected to an input register 67, and is also connected to the selector switch 70. The selector switch 70 selectively supplies either the digital signal from the first input port $IN_1$ or the digital signal from the second input port $IN_2$ to the input register 66 in accordance with a control signal held in a control register 31 which will be hereinafter described.

Output terminals of the input registers 66 and 67 are connected to a data bus 68. The data bus 68 is connected to a data memory 71 for temporarily storing a data group, and is also connected through a buffer memory 79 to one of two inputs of a multiplier 72. A coefficient memory 74 for storing a coefficient data group is connected through a buffer memory 73 to the other input of the multiplier 72. A coefficient data of the coefficient data group is sequentially read from the coefficient memory 74 in accordance with a timing signal from a sequence controller 80 which will be hereinafter described, and is supplied to the buffer memory 73 to be held therein. The coefficient data held in the buffer memory 73 is supplied to the multiplier 72. An ALU 75 is provided for accumulating a calculation output from the multiplier 72. The calculation output from the multiplier 72 is supplied to one of two inputs of the ALU 75, and the data bus 68 is connected to the other input of the ALU 75. A calculation output of the ALU 75 is connected to an accumulator 76, and an output of the accumulator 76 is connected to the data bus 68. The data bus 68 is also connected to output registers 77 and 78. The output registers 77 and 78 hold signal data arithmetically processed, and output the holding data from a first output port $OUT_1$ and a second output port $OUT_2$, respectively.

An operation timing of data transfer and computation in the data memory 71, the multiplier 72, the coefficient memory 74, the ALU 75, the accumulator 76, etc. is controlled by the sequence controller 80. The sequence controller 80 is operated in accordance with a processing program written in a program memory 85 and a command from a microcomputer 83. A control signal as the command from the microcomputer 83 is supplied through an interface 82 to the control register 81 to beheld therein. The microcomputer 83 controls rewriting of the processing program and rewriting of the coefficient data in the coefficient memory 74 in accordance with key operation of a keyboard 84. The control register 81 has a plurality of holding bits where holding contents are preliminarily defined, and it is provided for exchange of information such as synchronization among the input digital audio signal, the DSP 50 and the microcomputer 83 and select control for the selector switch 70.

Although not shown, the DSP 50 includes further elements such as a memory control circuit for controlling data writing and reading to an external memory so as to prepare a delay data and a delay time memory for storing a delay time data group.

The DIR 65 is provided for demodulating a digital signal biphase-modulated.

In the above-mentioned DSP 50, the selector switch 70 normally selects the first input port $IN_1$. In this normal condition where the first input port $IN_1$ is selected, the digital audio signal supplied from the A/D converter 62 to the first input port $IN_1$ is supplied as a signal data through the selector switch 70 to the input register 66. In synchronism with the signal data to the input register 66, a program counter (not shown) is operated to count from an initial value, and an operation step of the program is sequentially read from the program memory 85 to be supplied to the sequence controller 80. Assuming that the program written in the program memory 85 has an instruction step of transferring the signal data input into the input register 66 to the data memory 71, and that the program is a first program for carrying out predetermined arithmetic processing, the sequence controller 80 generates a timing signal as an operation command in accordance with the transfer instruction step, thereby transferring the signal data held in the input register 66 through the data bus 68 to the data memory 71 and writing the signal data at a predetermined address in the data memory 71.

In the predetermined arithmetic processing, the input signal data to the first input port $IN_1$ is sequentially transferred and written to the data memory 71, and the signal data stored in the data memory 71 is sequentially read to be supplied to the buffer memory 79 and held therein. On the other hand, the coefficient data is sequentially read from the coefficient memory 74, and is supplied to the buffer memory 73 to be held therein. The coefficient data is supplied from the buffer memory 73 to the multiplier 72, and the signal data is supplied from the buffer memory 79 to the multiplier 72. Then, the coefficient data is sequentially multiplied by the signal data in the multiplier 72. A multiplication result from the multiplier 72 is accumulated to a previous value (i.e., a value held in the accumulator 76) in the ALU 75. An accumulation result from the ALU 75 is supplied to the accumulator 76 to be held therein.

In the case where the same arithmetic processing as by the first program is applied to the digital audio signal supplied from the DIR 65 to the second input port $IN_2$ under the selected condition of the first input port $IN_1$ in the selector switch 70, the prior art device requires to rewrite the first program in the program memory 85 to a second program having an instruction step of transferring the signal data input into the input register 67 to the data memory 71 for carrying out the predetermined arithmetic processing.

When, however, the keyboard 84 is operated under the selected condition of the first input port $IN_1$ to generate an input port select command signal, the microcomputer 83 supplies a new control signal through the interface 82 to a predetermined bit position (connected to the selector switch 70) in the control register 81. Accordingly, the holding content at the predetermined bit position in the control register 81 is inverted from a logic "0" to "1", for example. Therefore, the selector switch 70 is operated to select the second input port $IN_2$. Under the selected condition of the second input port $IN_2$, the digital audio signal supplied from the DIR 65 to the second input port $IN_2$ is supplied as a signal data through the selector switch 70 to the input register 66. Thus, the signal data supplied to the second input port $IN_2$ is supplied to the input register 66 to be held therein. Accordingly, the first program stored in the program memory 85 is not required to be rewritten, provided that the predetermined arithmetic processing is to be carried out. That is, in synchronism with the signal data from the second input port $IN_2$ to the input register 66, the program counter is operated to count from an initial value, and the operation step of the first program is sequentially read from the program memory 85 to be supplied to the sequence controller 80. Then, the sequence controller 80 generates a timing signal in accordance with the transfer instruction step in the first program to thereby transfer the signal data held in the input register 66 through the data bus 68 to the data memory 71 and write the signal data at a predetermined address in the data memory 71.

The digital audio signal is a parallel data signal formed from a plurality of bits indicative of audio information, clock bits, and right and left channel bits. The right and left channel bits indicate which of the right and left channels is the audio information. For example, a logic "1" indicates the left channel, and a logic "0" indicates the right channel. The right and left channel bits are supplied to the control register 81. In synchronism with inversion of the logic "0" to the logic "1" of the right and left channel bits, for example, the program counter is operated to count from an initial value, and the sequence controller 80 generates a timing signal.

Although the selector switch 70 selectively supplies to the input register 66 one of the signals input to the first and second input ports $IN_1$ and $IN_2$ in the above DSP 50, it may selectively supply to a single input register one of plural signals input to three or more input ports.

As described above, there is provided a selector means for selectively connecting one of plural input ports to a single input register in accordance with a control signal. Accordingly, the same arithmetic processing as that applied to a digital signal supplied to the first input port can be applied to a digital signal supplied to the second input port without changing a program written in an internal memory. As a result, the number of programs to be stored into the internal memory in the microcomputer can be reduced, so that a memory having a large storage capacity is not necessary to thereby reduce a cost. Further, a frequency of rewriting of the program in the DSP can be reduced to thereby lighten a burden of processing by the microcomputer.

Further, the two digital signals supplied to the first and second input ports can be simultaneously processed by using the DSP with cascade connection or simultaneously inputting output signals of two systems from a 4-channel A/D converter.

What is claimed is:

1. A digital audio signal processing device comprising:
   arithmetic processing means for arithmetically processing an input digital audio signal at high speed in accordance with a predetermined program;
   holding means for holding an output data from said arithmetic processing means and outputting a holding data at a timing synchronous with a clock pulse to be supplied thereto;
   D/A converting means for converting the output holding data into an analog signal; and
   clock pulse generating means for supplying a first clock pulse synchronous with an operation timing of said arithmetic processing means to the holding means;
   said digital audio signal processing device further comprising control means for generating a select command in order to read said holding data of said holding means;
   wherein said clock pulse generating means supplies a second clock pulse having a frequency lower than that of said first clock pulse to said holding means in response to said command.

2. The digital audio signal processing device as defined in claim 1, wherein said control means reads an output data from said holding means, detects a level of said digital audio signal processed in said arithmetic processing means in accordance with the read output data and controls said arithmetic processing means in accordance with the detected level.

3. A digital audio signal processing device having a DSP (digital signal processor) comprising:
   a plurality of input ports for inputting digital audio signals to be processed;
   a plurality of input registers corresponding to said input ports for holding the digital signals supplied to said input ports, said input registers having outputs connected to a common data bus; and selector means for selectively connecting one or another of said input ports to one of said input registers according to a control signal, whereby digital signals from said input ports applied via said one input register are subjected to a predetermined arithmetic process program, without requiring a rewriting of said predetermined arithmetic process program upon operation of said selector means.

4. The digital audio signal processing device as defined in claim 3, wherein said selector means has a control register for holding a port select command signal to be externally supplied thereto as said control signal.

5. A digital audio signal processing device as defined in one of claims 1 to 4, further including an audio apparatus for compensating a frequency characteristic of an input audio signal in a sound system having a sound level adjusting means in an audio signal line, said audio apparatus comprising:

level detecting means for detecting a level of said input audio signal;

position detecting means for detecting an operational position of said sound level adjusting means; and filter means provided in said audio signal line and having a frequency characteristic to be changed in accordance with detected outputs from said level detecting means and said position detection means, wherein said level detecting means and said filter means are realized in arithmetic processing by said digital audio signal processing device.

6. The audio apparatus as defined in claim 5, wherein said level detecting means and said filter means are realized in arithmetic processing by a DSP.

7. A digital audio signal processing device as defined in one of claims 1 to 4, further including an audio apparatus comprising:

at least two level detecting means each having a variable band filter passing only a component of an input signal in a band designated by a band designating signal to be supplied thereto for detecting output levels of said variable band filters;

designating signals generating means for generating said band designating signal designating one of plural different frequency bands at a predetermined timing and alternately supplying said band designating signal to said two level detecting means; and control means for reading a detection level by said level detecting means when a predetermined time has elapsed after supplying of said band designating signal into said variable band filter and indicating the read detection level corresponding to each band indicating means, wherein said level detecting means are realized in arithmetic processing by said digital audio signal processing device.

8. The audio apparatus as defined in claim 7, wherein said level detecting means are realized in arithmetic processing by a DSP.

9. The audio apparatus as defined in claim 7, wherein said each level detecting means further includes, in addition to said variable band filter, a detecting circuit for detecting an output signal from said variable band filter and an LPF (low pass filter) for averaging an output signal from said detecting circuit.

* * * * *